United States Patent
Brooks et al.

(10) Patent No.: US 6,740,971 B2
(45) Date of Patent: *May 25, 2004

(54) CAVITY BALL GRID ARRAY APPARATUS HAVING IMPROVED INDUCTANCE CHARACTERISTICS

(75) Inventors: Jerry M. Brooks, Caldwell, ID (US); Steven G. Thummel, Boise, ID (US)

(73) Assignee: Micron Technology, Inc., Boise, ID (US)

(*) Notice: Subject to any disclaimer, the term of this patent is extended or adjusted under 35 U.S.C. 154(b) by 9 days.

This patent is subject to a terminal disclaimer.

(21) Appl. No.: 10/011,525

(22) Filed: Nov. 5, 2001

(65) Prior Publication Data

US 2002/0042160 A1 Apr. 11, 2002

Related U.S. Application Data

(63) Continuation of application No. 09/567,633, filed on May 9, 2000, now Pat. No. 6,326,244, which is a continuation of application No. 09/146,643, filed on Sep. 3, 1998, now Pat. No. 6,084,297.

(51) Int. Cl.$^7$ ..................... H01L 23/053; H01L 23/48; H01L 23/02
(52) U.S. Cl. ............. 257/738; 257/786; 257/737; 257/699; 257/698; 257/784; 257/710; 257/691; 257/664; 257/693
(58) Field of Search .................. 257/698, 693, 257/699–707, 664, 691, 710, 734, 737, 738, 784, 786

(56) References Cited

U.S. PATENT DOCUMENTS

| | | |
|---|---|---|
| 3,697,666 A | 10/1972 | Wakley et al. |
| 4,410,927 A | 10/1983 | Butt |
| 4,542,259 A | 9/1985 | Butt |
| 4,761,518 A | 8/1988 | Butt et al. |
| 4,831,212 A | 5/1989 | Ogata et al. |
| 5,397,921 A | 3/1995 | Karnezos |
| 5,409,865 A | 4/1995 | Karnezos |
| 5,455,456 A | 10/1995 | Newman |
| 5,490,324 A | * 2/1996 | Newman .................. 257/700 |
| 5,529,959 A | 6/1996 | Yamanaka |
| 5,563,446 A | 10/1996 | Chia et al. |
| 5,586,010 A | 12/1996 | Murtuza et al. |
| 5,594,275 A | 1/1997 | Kwon et al. |
| 5,596,227 A | 1/1997 | Saito |
| 5,598,033 A | 1/1997 | Behlen et al. |
| 5,598,036 A | 1/1997 | Ho |
| 5,598,321 A | 1/1997 | Mostafazadeh et al. |
| 5,708,567 A | * 1/1998 | Shim et al. .................. 257/675 |
| 5,763,939 A | * 6/1998 | Yamashita .................. 257/668 |

(List continued on next page.)

Primary Examiner—Alexander O. Williams
(74) Attorney, Agent, or Firm—TraskBritt

(57) ABSTRACT

A ball grid array (BGA) package includes a central cavity for receiving a semiconductor die therein. The die rests on a base laminate, the die side of which includes traces therein extending into the cavity, which is framed at least by an anisotropically-conductive adhesive layer. Bond pads on the die are electrically connected, as by wire bonds or, in the case of a flip-chip configured die, solder balls or conductive adhesive elements, to the traces. The traces are, in turn, electrically connected through conductive vias to conductive element sites on the opposite side of the base laminate through a dielectric layer, the conductive element sites carrying solder balls or other discrete conductive bonding elements for connection to higher-level packaging. A ground or other reference voltage plane, which is also electrically connected to at least one trace through the anisotropically-conductive adhesive layer, may extend over the adhesive layer and frame the cavity, or also extend over the cavity to provide an enclosure for the die. In the former case, an encapsulant is applied over the die and electrical connections to the traces.

55 Claims, 4 Drawing Sheets

U.S. PATENT DOCUMENTS

| | | | |
|---|---|---|---|
| 5,896,276 A | | 4/1999 | Tamura et al. |
| 5,909,058 A | * | 6/1999 | Yano et al. .................. 257/712 |
| 5,943,558 A | | 8/1999 | Kim et al. |
| 6,084,297 A | * | 7/2000 | Brooks et al. ............... 257/698 |
| 6,117,705 A | | 9/2000 | Glenn et al. |
| 6,127,833 A | * | 10/2000 | Wu et al. .................... 324/755 |
| 6,150,193 A | | 11/2000 | Glenn |
| 6,168,970 B1 | | 1/2001 | Burns |
| 6,171,888 B1 | | 1/2001 | Lynch et al. |
| 6,455,925 B1 | * | 9/2002 | Laureanti ..................... 257/678 |

* cited by examiner

CAVITY BALL GRID ARRAY APPARATUS HAVING IMPROVED INDUCTANCE CHARACTERISTICS

CROSS-REFERENCE TO RELATED APPLICATION

This application is a continuation application Ser. No. 09/567,633 filed May 9, 2000 now U.S. Pat. No. 6,326,244, which is a continuation of application Ser. No. 09/146,643, filed Sep. 3, 1998, now U.S. Pat. No. 6,084,297, issued Jul. 4, 2000.

BACKGROUND OF THE INVENTION

This invention relates generally to integrated circuit packages and, more particularly, to the fabrication of integrated circuit packages having multiple layers, and the resulting structure. More particularly still, the present invention relates to a fully populated ball grid array integrated circuit package providing a cavity for mounting of a semiconductor die therein and a ground plane element extending about or optionally over the die.

In recent years, semiconductor miniaturization has resulted in the development of very large scale integrated circuit ("VLSI") devices including perhaps thousands of active components thereon. Such devices may typically be encapsulated in a protective package providing a large number of pin-outs for mounting or interconnection to external circuitry through a carrier substrate such as a printed circuit board or other higher-level packaging. The pin-outs for such packages may include, for example, a pin grid array ("PGA"), or a ball grid array ("BGA"). Both PGA and BGA packages allow for surface mounting upon a printed circuit board. PGA arrays include a two-dimensional array of metal pins that can be directly connected, as by soldering, to the printed circuit board or inserted in a mating socket arrangement carried by the board. On the other hand, a BGA array includes a two-dimensional array of conductive elements formed as, for example, balls, bumps or pillars instead of metal pins. The conductive elements may, by way of example only, be formed as solder (typically lead/tin, although other alloys are employed) balls, may each comprise a relatively higher melting point ball or bump having a solder or other relatively lower melting point outer covering, or may comprise conductive bumps or pillars formed of a conductive or conductor-filled adhesive such as an epoxy.

The bond pads of the semiconductor die disposed within a package must be connected to the printed circuit board via conductors carried by the package, either by direct contact therewith in a flip-chip orientation through conductive balls, bumps or pillars or, alternatively, by intermediate connector elements comprising wire bonds, or TAB (flexible circuit) connections. Finally, the semiconductor die is usually protected on the package by an encapsulant of a plastic, epoxy or silicone material or by being housed in a rigid-walled chamber. Exemplary BGA structures are disclosed in the following U.S. Pat. Nos. 5,397,921, 5,409,865, 5,455,456, 5,490,324, 5,563,446, 5,586,010, 5,594,275, 5,596,227, 5,598,033, 5,598,036, 5,598,321 and 5,708,567. BGA packages are offered by various manufacturers and include, among others, the Tessera μBGA, the Advanced Semiconductor Assembly Technology BGA, the Motorola PBGA (OMPAC), the Yamichi YFlex-LCP, the ProLinx VBGA™, and the IBM TBGA.

The use of BGA packages is becoming widely accepted within the industry due to the ability of BGA designs to accommodate a large number of I/Os, the number of which appears to be ever-increasing for all die types, in the relatively compact area defined within the conductive element array. However, a number of conventional BGA packages are not capable of supporting a fully populated array of conductive ball elements, as the manner in which the die is mounted in the package, or electrically connected to the package traces, requires a conductive element-devoid area in the middle of the conductive element array and so limits the number of solder balls or other conductive elements in the array.

In addition, there is a continued trend in the computer industry toward ever-higher speed integrated circuit (IC) assemblies based upon semiconductor die technology. Such high signal speeds, however, lack utility unless accompanied by suppression of system noise to an acceptable level. The trend toward lower operational signal voltages in combination with such high speeds exacerbates noise problems.

At state-of-the art operational speeds, signal propagation delays, switching noise, and crosstalk between signal conductors resulting from mutual inductance and self inductance phenomena of the conductive paths all become significant to signal degradation. Mutual inductance results from an interaction between magnetic fields created by signal currents flowing to and from a packaged IC die through leads or traces, while self inductance results from the interaction of the foregoing fields with magnetic fields created by oppositely directed currents flowing to and from ground.

Therefore, the integrated circuits carried on a semiconductor die would ideally be electrically connected to conductive traces on carrier substrates such as printed circuit boards and thus to other integrated circuits carried on the same or other such substrates by infinitesimally short conductors, eliminating impedance problems such as undesirable inductance and other conductor-induced system noise.

As a practical matter, however, as the capacity and speed of many integrated circuit devices such as dynamic random access memories (DRAMs) have increased, the number of inputs and outputs (I/Os) to each die has increased, requiring more numerous and complex external connections thereto and, in some instances, requiring undesirably long traces to place the bond pads serving as I/Os for the typical die in communication with the traces of the carrier substrate.

While lead inductance in IC packages has not traditionally been troublesome because slow signal frequencies of past devices render such inductance relatively insignificant, faster and ever-increasing signal frequencies of state-of-the-art electronic systems have substantially increased the practical significance of package lead or trace inductance. For example, at such faster signal frequencies, performance of IC dice using extended leads or traces for external electrical connection is slower than desirable because the inductance associated with the elongated conductive paths required slows changes in signal currents through the leads or traces, prolonging signal propagation therethrough. Further, digital signals propagating along the leads or traces are dispersing or "spreading out" because the so-called "Fourier" components of various frequencies making up the digital signals propagate through the inductance associated with the leads or traces at different speeds, causing the signal components and thus the signals themselves to disperse. While mild dispersion merely widens the digital signals without detrimental effect, severe dispersion can make the digital signals unrecognizable upon receipt. In addition, so-called "reflection" signals propagating along the leads or traces as a result of impedance mismatches between the lead fingers and associated IC die or between the leads or traces and external circuitry, caused in part by lead-associated inductance, can distort normal signals propagating concurrently with the reflection signals. Further, magnetic fields created by signal currents propagating through the lead or trace-associated inductance can induce currents in adjacent leads or traces, causing so-called "crosstalk" noise on the latter. While these various effects might be troublesome in any electronic system, the aforementioned trend toward lower voltage systems (currently 3.3 volts) and away from the traditional 5.0 volt systems increases their visibility and significance.

The ever-more-popular BGA die and package configurations described previously serve to exacerbate the noise problems by favoring a large plurality of laterally adjacent traces of substantial and varying lengths extending from adjacent, generally centralized die locations to the horizontally spaced, offset locations of vias extending to solder balls or other conductive elements for securing and electrically connecting the package to a carrier substrate. While a mechanically and electrically desirable packaging concept to accommodate the ever-increasing numbers of I/Os for state-of-the-art dice, long, varying-length, closely mutually adjacent trace runs over the package substrate become abusive in terms of unacceptably increasing real impedance as well as lead inductance (both self and mutual) in the circuit. These trace runs also increase 1) signal reflection in the circuit due to transmission line effects and degrade signal integrity due to the aforementioned, 2) propagation delays, 3) switching noise, 4) crosstalk and 5) dispersion. Further, elimination of a die-attach pad, as in many BGA packages, also eliminates the potential for employing a ground plane under the die, and such a ground plane in any case would not alleviate the problems attendant to use of the long package trace runs.

Therefore, it would also be desirable for a BGA package to accommodate and substantially overcome inductance-related deficiencies so that full advantage of the beneficial aspects of the packaging concept might be realized in a relatively simple, cost-effective BGA package.

BRIEF SUMMARY OF THE INVENTION

The present invention provides a BGA package supporting a fully populated array of solder balls or other conductive elements and exhibiting superior inductance characteristics.

The BGA package of the present invention comprises a base laminate or sandwich of a dielectric interposed between two conductive sheets and which, in turn, are respectively partially covered by two outer insulative layers. One conductive sheet is patterned to provide sites for the conductive elements of an array for connecting the semiconductor die of the package to external circuitry. The other conductive sheet is patterned to define a plurality of conductive traces, each trace extending from an interior die-attach location on the laminate to a location above a conductive site, or to a location suitable for connection to a ground plane for the package. A conductive die-attach pad may be provided at the same time as the traces and communicate with a trace for providing a ground or reference voltage for the semiconductor die. Vias formed with conductive material extend from the traces on one side of the laminate through the dielectric to the conductive element sites on the opposing side. An anisotropically or "Z-axis" conductive adhesive layer in the form of a film configured as a frame is then applied over the trace side of the laminate to define an interior region cavity including the die-attach location as well as openings in the frame to allow electrical connection between a conductive stiffener for the package formed as a lid extending over the die-attach location and appropriate conductive traces. The cavity is large enough to leave inner trace ends exposed for connection of bond pads of the semiconductor die thereto by wire bonds, although the invention is not limited to this interconnection technology. For example, the inner trace ends may be patterned as a conductive pad array to connect to intermediate conductive elements such as solder balls or epoxy pillars protruding from the active surface of a flip-chip configured die placed face down on the laminate.

A ground or other voltage reference plane element (hereinafter sometimes referenced generally as a "reference plane element") is secured to the adhesive layer. Various embodiments of the structure of the BGA package of the invention include differing reference plane element structures, which in turn also permit different die enclosure techniques. In each embodiment, however, the insulative layer over the traces is provided with at least one through hole for connection of one or more circuit traces to the reference plane element by mutual contact with the anisotropically conductive adhesive layer.

In one embodiment, the reference plane element is also formed as a frame of like size and shape to the adhesive frame, and placed thereover in alignment therewith, providing a deepened cavity. It should be noted that the use of a relatively thick, and thus rigid, reference plane element permits the use of a flexible, tape-type base laminate in the package, and also provides additional mass to facilitate heat transfer from the semiconductor die. After the semiconductor die is back-bonded to the die-attach location on the base laminate, connections are formed between the traces and the bond pads of the die, after which the die, inner trace ends and connections may be encapsulated with a so-called "glob top" of dielectric material, providing physical and environment protection for the encapsulated elements. The reference plane element and underlying adhesive provide a four-sided dam to prevent unwanted lateral encapsulant spread.

In another embodiment, the reference plane element comprises an imperforate conductive sheet extending over the cavity defined by the adhesive frame. If the adhesive is particularly thick, the semiconductor die relatively thin, or a recess is provided in an unusually thick dielectric portion of the base laminate, the reference plane element may be planar in nature, providing a flat lid for the cavity containing the die. If, however, the die thickness plus the height of connecting elements such as wire bonds exceeds the thickness of the adhesive frame, the reference plane element may be formed with a central dome or protrusion over the cavity area to provide adequate clearance. Such a feature may also enhance package rigidity, while permitting use of thinner conductive sheet material for the reference plane element. In this embodiment, the die is connected to the conductive traces of the base laminate before the reference plane element is applied. A thick encapsulant may again be used to protect the die and connections, but it may be preferred, in this instance, to employ a low viscosity dielectric material to merely coat the exterior of the die and the connections to prevent shorting of the latter against the inner side of the reference plane element.

As alluded to previously, yet another embodiment of the invention includes a package configured for use with a flip-chip configured semiconductor die, wherein the upper conductive sheet of the base laminate is patterned with traces having ends configured and arranged in an array of pads or terminals for contact with intermediate conductive elements, such as solder balls or conductive epoxy pillars, protruding transversely from the active surface of the die. An encapsulant may be employed to surround and in-fill between the active surface of the die and the pads, or a reference plane element employed as a lid over the cavity area to enclose the die.

DETAILED DESCRIPTION OF THE INVENTION

Figure 1:
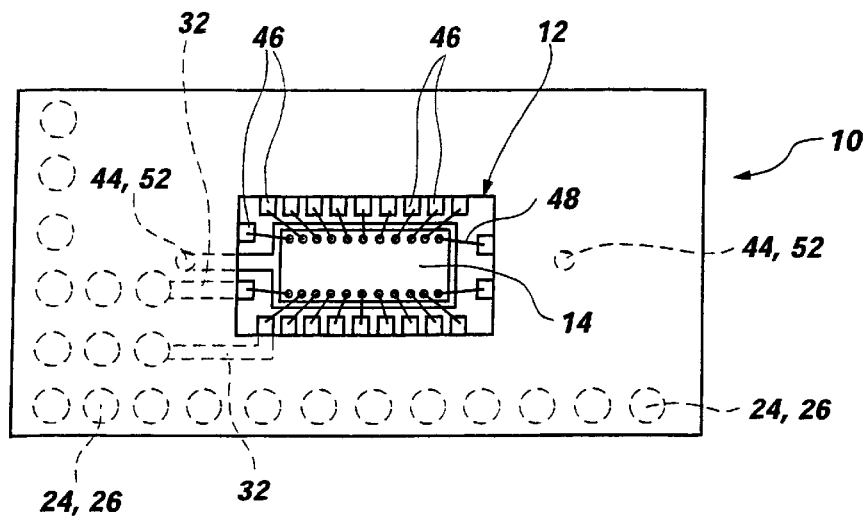
FIG. 1 is a top view of one embodiment of a ball grid array package according to the present invention.
Figure 2:
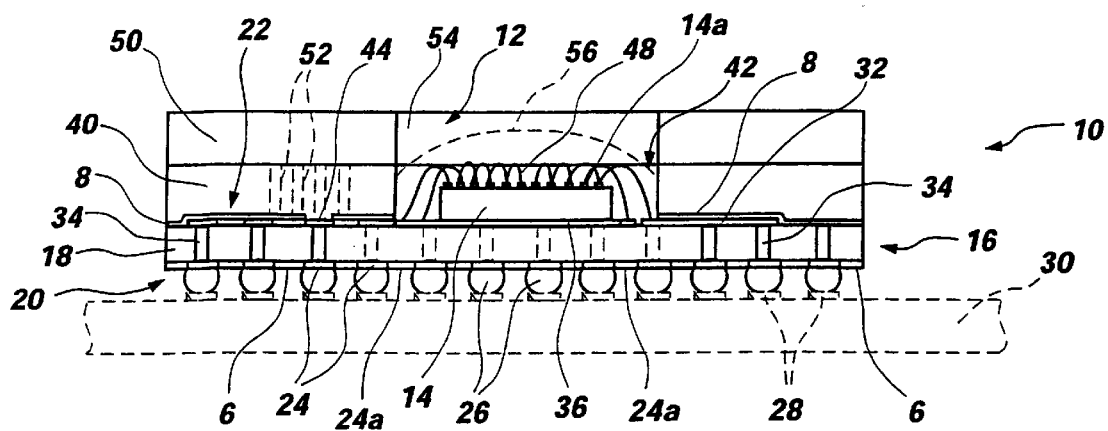
FIG. 2 is a partial cross-sectional side view of the ball grid array package according to FIG. 1.

FIGS. 1 and 2 depict an exemplary ball grid array integrated circuit ("IC") package 10 having a cavity 12, shown in cross-section in FIG. 2, for receiving an integrated circuit device, such as a semiconductor die 14. In some instances, the number of elements depicted on these and the remaining drawing figures herein has been limited for clarity of illustration only, and is not intended or to be taken as a limitation on the invention as claimed.

IC package 10 includes a base laminate 16 formed of a dielectric film or sheet 18, which may comprise a polyimide such as a KAPTON® film, sandwiched between two conductive layers 20 and 22, preferably of copper, over which are located two insulative layers 6 and 8, preferably of Taiyo 9000® solder mask, although other alternative materials are suitable. The base laminate 16 may be procured as one system through Shedahl, Inc. of Northfield, Minn. as ViaThin® integrated circuit substrate. In the package 10 as illustrated, the lower conductive layer 20 has been patterned to define an exemplary 6×12 array of pad-type conductive element sites 24 (only some shown for clarity) on which a like number of conductive elements 26 for connecting die 14 to external circuitry 28 on a carrier substrate 30 (shown in broken lines in FIG. 2) are placed or formed. The copper conductive element sites 24 are preferably plated with nickel and then gold before conductive elements 26, in the form of tin/lead solder balls, are formed thereon. The upper conductive layer 22 has been patterned to define a plurality of circuit traces 32, the trace inner ends 46 of at least some of which extend from locations within cavity 12 to locations of conductive vias 34 extending through dielectric film 18 to conductive element sites 24. Upper conductive layer 22 may also be patterned to provide a conductive die-attach pad 36, as well as traces 32 extending to the locations of vias 34 and sites 44 for connection of a ground or reference plane thereto, as hereinafter described. Die-attach pad 36 and traces 32 (or at least trace inner ends 46) preferably comprise a lay-up of gold over nickel over the copper of layer 22.

Patterning of the conductive layers 20 and 22 may be effected by any technique known in the art, such as application of a positive or negative photoresist, selective exposure of the resist layer through a mask to define the desired pattern followed by removal of the unfixed resist from the sheet, and chemical etching of the exposed conductive sheet material. Formation of the conductive vias 34 may be effected by 1) photo-etching, laser ablation or numerically controlled punching of apertures through the laminate structure followed by 2) electroless or electrolytic plating of a metal, preferably copper.

After conductive element sites 24 and traces 32 have been defined and conductive vias 34 formed and filled, solder mask insulative layers 6 and 8 are respectively formed over the lower and upper surfaces of the laminate. Apertures exposing conductive element sites are defined through lower solder mask layer 6, while upper solder mask layer 8 is imperforate except over die-attach pad 36 or a die-attach area of the upper surface of the base laminate if no die-attach pad is employed and at locations where conductive paths of Z-axis adhesive layer 40 (see below) are to connect to vias 34 extending through base laminate 16 and connecting a conductive ground or reference plane element 50 (see below) to a conductive element site 24 and its associated conductive element 26. It should be noted that lower solder mask layer 6 defines the locations for conductive elements 26 in the form of solder balls or bumps formed or placed on conductive element sites 24 and constrains migration of the solder during reflow when the package 10 is attached to a carrier substrate 30.

A Z-axis adhesive layer 40, which may comprise Nitto ACF® anisotropic conductive film available from Nitto Denko America, Inc. of Fremont, Calif., is applied over the base laminate 16 to at least partially define cavity 12 in which die 14 will reside. As known to those of ordinary skill in the art, a "Z-axis" or anisotropically conductive adhesive comprises an adhesive or adhesively coated dielectric or insulative film or layer having laterally separated conductive paths 52 (some shown in broken lines) extending therethrough in an orientation transverse to the plane of the film or layer. Adhesive layer 40 is preferably applied in the form of a frame-shaped, preform sheet by which one or more traces 32 may be electrically connected to ground or reference plane element 50. Trace inner ends 46 of traces 32 extend from under adhesive layer 40 into central aperture 42 framed thereby, so that bond pads 14a of die 14 may be wire-bonded or otherwise connected as shown at 48 to the trace inner ends 46.

In the embodiment of FIGS. 1 and 2, a frame-shaped ground or reference plane element 50 having a central aperture 54 of like size and shape with central aperture 42 of adhesive layer 40 is applied over adhesive layer 40 in alignment therewith. The combined thicknesses of adhesive layer 40 and reference plane element 50 define the depth of cavity 12. Ground or reference plane element 50 is preferably formed of copper, and may be selected to be at least of a thickness to provide desired rigidity to package 10. Additional thickness may be incorporated in reference plane element 50 to provide a heat sink and facilitate heat transfer from die 14. Z-axis adhesive layer 40 electrically connects ground or reference plane element 50 to the upper end of a via 34 exposed through an aperture in solder mask layer 8. In fabricating package 10, a complete base laminate 16 with conductive elements 26, Z-axis adhesive layer 40 and reference plane element 50 is assembled prior to affixation of die 14 thereto.

Die 14 may then be secured to a conductive die-attach pad 36 (if used) by a conductive epoxy, silver solder, or other conductive bonding agent known in the art. If a conductive back side connection for die 14 is not required, numerous bonding agents may be employed. Further, if die 14 is secured by a dielectric adhesive, traces 32 may be patterned to extend from the edge of die 14 back under the die-attach adhesive for connection through vias 34 to underlying conductive element sites 24 to achieve the aforementioned fully populated array of conductive elements 26. Alternatively, if a conductive die-attach pad 36 is employed, traces 24a may be patterned on the lower conductive layer 20 extending from vias 34 laterally offset from die 14 to conductive element sites 24 directly under die 14. Die 14, attached to die-attach pad 36 with a conductive bonding agent, may be connected through an appropriate via 34, conductive element site 24 and conductive element 26 typically to $V_{ss}$ (ground) or $V_{bb}$ (back bias, or reference, potential), or even possibly to $V_{cc}$ (power), depending upon the application. In the latter instance, use of a non-conductive die-attach adhesive would naturally be required. However, using die-attach pad 36 for power as suggested provides great flexibility in the number of options available for connecting power input bond pads of the die 14 to the die-attach pad 36.

Subsequent to die attach, wire bonds 48 are formed between bond pads 14a of die 14 and trace inner ends 46, using gold, aluminum, or other suitable materials as known in the art. After wire bonding is completed, a so-called "glob top" encapsulant 56 (shown for clarity in broken lines) comprising a mass of non-conductive epoxy or silicone may be applied over die 14 to fill cavity 12 to a level high enough to submerge the wire bonds 48 in encapsulant to protect the package components within cavity 12 against physical and environmental damage. It is desirable that encapsulant 56 be thermally conductive to facilitate heat transfer from die 14 during operation. A suitable thermally conductive, electrically insulative encapsulant may by a Hysol® compound, as offered by Dexter Electronic Materials of Industry, California.

Figure 3:
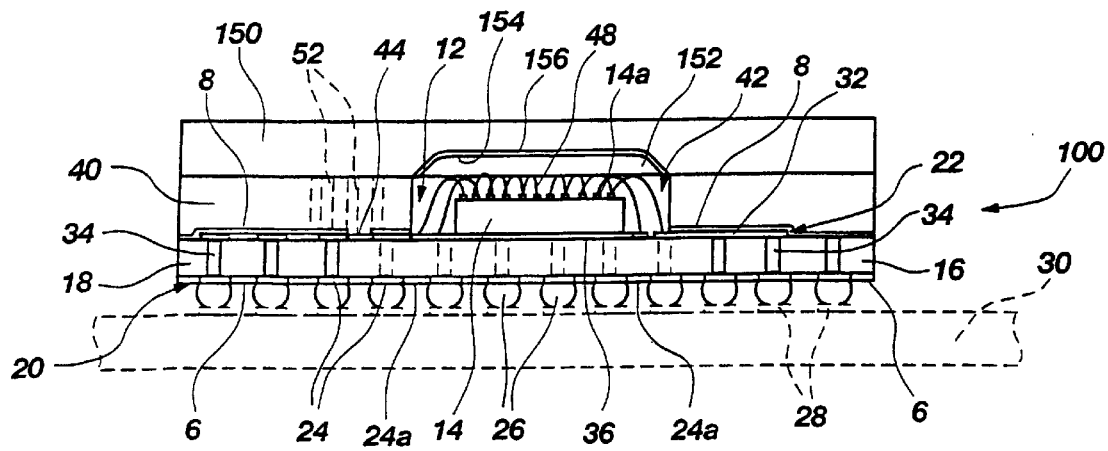
FIG. 3 is a partial cross-sectional side view of a first variant of another embodiment of the ball grid array package of the invention.

Referring now to FIG. 3, another embodiment 100 of the package of the present invention is depicted. The same reference numerals are employed in FIG. 3 to identify the same features as in FIGS. 1 and 2 for clarity. Package 100 is similar to package 10, with the base laminate 16, conductive element sites 24, conductive elements 26, traces 32, solder mask insulative layers 6 and 8, die-attach pad 36 (if employed) and anisotropically conductive adhesive layer 40 being configured and assembled as described with respect to package 10. It is at this juncture, differing from the assembly process for package 10, that die 14 would be attached and wire-bonded, before a ground or reference plane element 150 is affixed. The ground or reference plane element 150 of package 100 is configured as an imperforate, substantially planar sheet (again, preferably of copper) extending over cavity 12 and providing a lid therefore, the combination of adhesive layer 40 and reference plane element 150 providing an environmentally sealed chamber 152 for die 14. In this embodiment, of course, the thickness of adhesive layer 40 may be sufficient to provide clearance for die 14 and wire bonds 48 under ground or reference plane element 150. Alternatively, reference plane element 150 may be provided with an underside recess 154 to be aligned with cavity 12. While a "glob top" encapsulant is not required in this embodiment, a low-viscosity dielectric material may be applied after wire-bonding to prevent shorting of the wire bonds 48 against the underside of reference plane element 150. Alternatively, a dielectric film 156 may be applied to the underside of reference plane element 150 in the central area wherein it extends over cavity 12.

Figure 4:
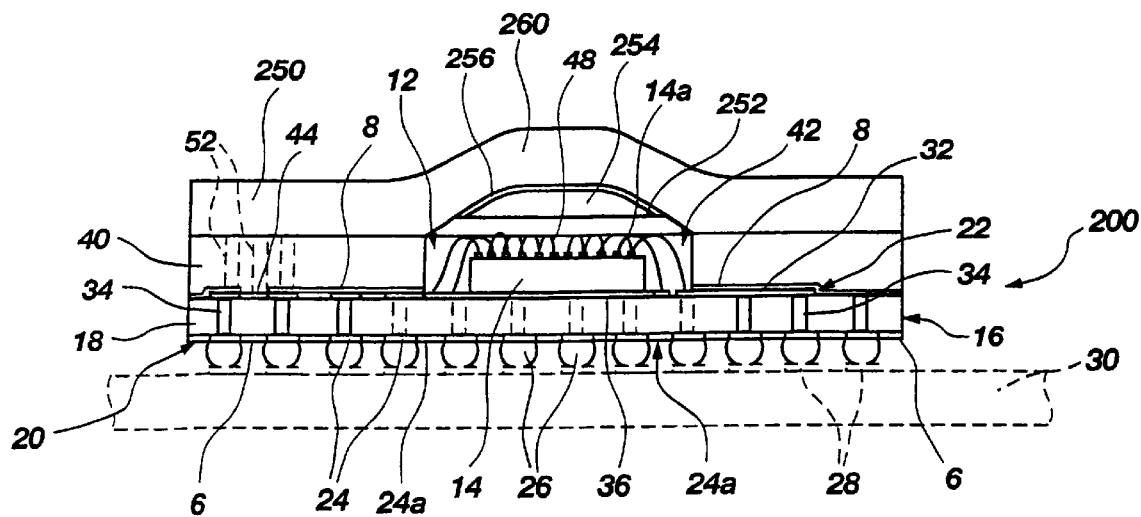
FIG. 4 is a partial cross-sectional side view of a second variant of the embodiment of FIG. 3 of the ball grid array package of the present invention.

Referring now to FIG. 4, a variation 200 of package 100 is depicted. Package 200 and its assembly process flow are similar to that of package 100, and the same reference numerals are used in FIG. 4 to identify the same features present in FIGS. 1–3. Ground or reference plane 250 of package 200, rather than being planar, includes a central dome or protrusion 260 defining a recess 254 thereunder, which is located to be above cavity 12 in assembled package 200 and thus define an environmentally sealed chamber 252 of enhanced height to clear die 14 and wire bonds 48. Such a configuration may be required to accommodate an unusually thick die or excessive wire bond height. Again, a dielectric film 256 may be formed on the underside of ground or reference plane 250 to preclude wire bond shorting, or a dielectric coating may be applied to the wire bonds 48.

Figure 5:
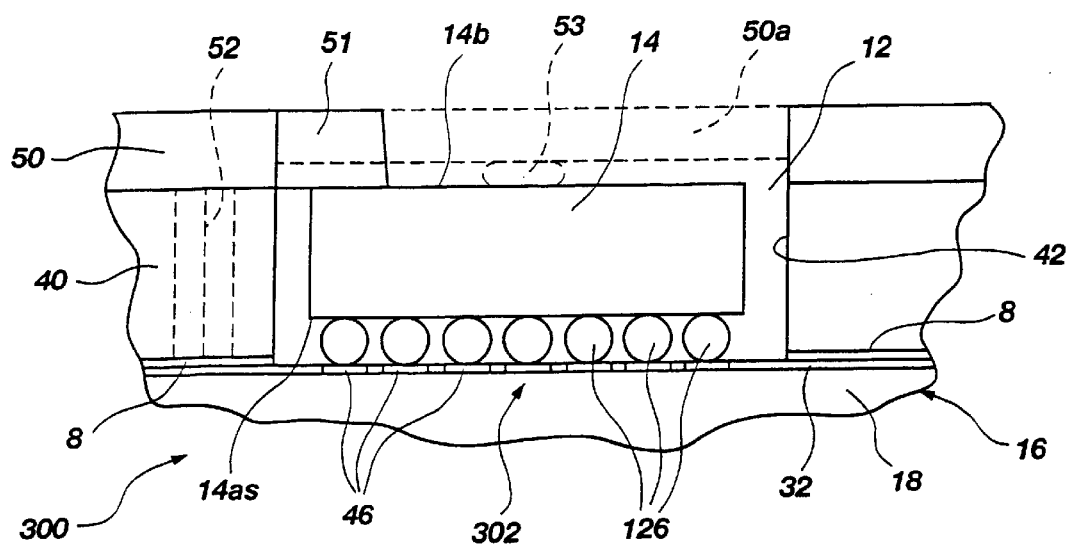
FIG. 5 is an enlarged partial cross-sectional side view of a flip-chip embodiment of the present invention.

In the embodiment of FIG. 5, a flip-chip configured die 14 is carried in package 300, only the die cavity 12 portion of which is depicted for clarity, all other aspects of package 300 corresponding to the structure of one or more of the previously described packages 10, 100 or 200. The same reference numerals are used in FIG. 5 to identify the same features present in FIGS. 1 through 4. In package 300, die-attach pad 36 is eliminated and base laminate 16 includes traces 32 extending into cavity 12 defined by central aperture 42 of adhesive layer 40 and terminating at trace inner ends 46 sized, shaped and located to define a terminal array 302 configured to connect to intermediate conductive elements 126 extending transversely from active surface 14 as of a flip-chip configured die 14. Conductive elements 126 may comprise solder, or a conductive- or conductor-carrying adhesive. Reference plane element 50 may surround cavity 12 as shown, or extend thereover as shown in broken lines at 50a. In the former instance, a connection between the back side 14b of die 14 and the reference plane element 50 may be effected by a wire or strap 51 (which may even comprise a protrusion of the reference plane material over central aperture 42), while in the latter instance, a conductive material such as a conductive epoxy or silver solder or even a resilient conductive element may be interposed between the back side 14b of the die and the underside of the reference plane element 50, such interposed structures shown in broken lines and generally designated by reference numeral 53 in FIG. 5.

In all its embodiments, the present invention comprises a packaged semiconductor device wherein inductance and impedance of a group of adjacent, substantially co-planar circuit traces is reduced, and reflection and signal integrity improved, through the use of at least one voltage reference plane element in close, overlapping or superimposed proximity to the plane of the traces. As noted above, while in many, if not most, instances the voltage potential will be connected to ground, or $V_{ss}$, it is contemplated that there are some applications where another reference potential may be employed with the plane element.

The reference plane element of the present invention reduces the self inductance associated with closely adjacent, elongated traces by reducing the magnetic flux caused by oppositely directed currents flowing in the traces and the reference plane element, typically ground. The reference plane element reduces the self inductance through an increase in effective width and a decrease in the distance between the voltage reference plane and the traces. Similarly, the immediate proximity of the reference plane element to closely laterally adjacent traces of the base laminate exhibiting troublesome inductance characteristics reduces mutual inductance by interruption of the magnetic fields generated by adjacent traces and thus the effects of their interaction. As a result of the presence of the reference plane element in the package, circuit switching times are reduced while noise is maintained at a tolerable level.

The voltage reference plane arrangement of the invention also provides at least a nominal heat sink effect to the semiconductor device as housed in the central cavity of the package, promoting more even distribution of heat generated during operation of the semiconductor die than might be achieved through the traces alone. As noted above, the heat sink effect may, of course, be enhanced by increasing the mass of the reference plane element, as by enhancing its thickness within the constraints of the package dimensions. A further advantage of the present invention resides in the bending and torsional rigidity, mechanical support and protection provided the traces, the base laminate and the package as a whole by the reference plane element.

Those skilled in the art will appreciate that semiconductor dice usable with packages according to the present invention may comprise an integrated circuit die 14 employed for storing or processing digital information, including, for example, a Dynamic Random Access Memory (DRAM) integrated circuit die, a Static Random Access Memory (SRAM) integrated circuit die, a Synchronous Graphics Random Access Memory (SGRAM) integrated circuit die, a Programmable Read-Only Memory (PROM) integrated circuit die, an Electrically Erasable PROM (EEPROM) integrated circuit die, a flash memory die and a microprocessor die, and that the present invention includes such devices within its scope. In addition, it will be understood that the shape, size, and configuration of dice and bond pads thereon may be varied without departing from the scope of the invention and appended claims.

Figure 6:
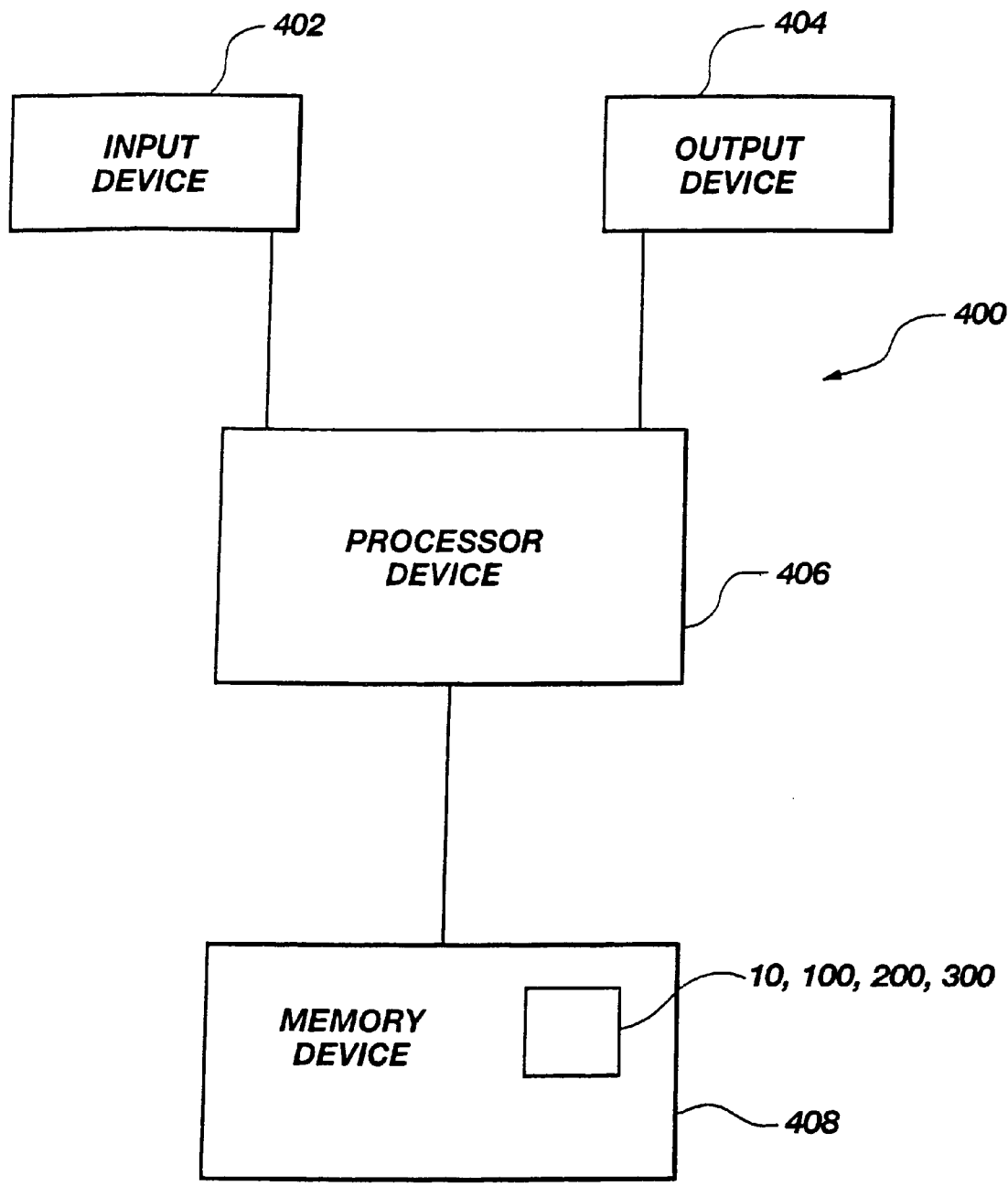
FIG. 6 is a block diagram of an electronic system incorporating the semiconductor package of the invention.

As shown in FIG. 6, an electronic system 400 includes an input device 402 and an output device 404 coupled to a processor device 406 which, in turn, is coupled to a memory device 408, at least one of the processor device 406 and the memory device 408 being configured as one of the exemplary integrated circuit packages 10, 100, 200 or 300 according to the invention.

Although the invention has been described in detail, it should be realized that certain modifications can be made within the scope and spirit of the invention by those skilled in the art. For example, although less preferred, in lieu of an anisotropic adhesive layer, an insulative layer defining one or more suitably placed apertures therethrough housing conductive materials may be employed to connect the ground or reference plane element to a trace on the base laminate, to a via therethrough and ultimately to higher-level packaging through a conductive element on the bottom of the base laminate. In such an arrangement, the upper insulative film may be eliminated. Conductive elements other than solder may be employed, and other materials may be substituted for those disclosed for use in the various other structural features of the invention. Therefore, the invention should be limited only by the following claims.

What is claimed is:

1. A semiconductor die package, comprising:
    a substantially planar base laminate comprising a dielectric having a plurality of conductive traces on an upper surface thereof extending proximately from an interior location of the base laminate to other locations coincident with conductive vias extending through the base laminate to associated conductive elements on a lower surface of the base laminate;
    a layer of dielectric material extending at least partially over the plurality of conductive traces on the upper surface of the base laminate and about the interior location to define a cavity having at least some conductive trace ends exposed therein, the layer of dielectric material having at least one conductive path extending transversely therethrough; and
    a ground plane element secured to an upper surface of the layer of dielectric material and electrically connected to at least one of the conductive vias by the at least one conductive path extending transversely through the layer of dielectric material, the ground plane element extending at least proximate the cavity and at least partially overlying portions of the conductive traces lying outside of the cavity.

2. The package of claim 1, wherein the layer of dielectric material having at least one conductive path extending therethrough comprises an anisotropically conductive material having a plurality of transverse conductive paths extending therethrough.

3. The package of claim 1, further including an insulative layer over the lower surface of the base laminate and defining locations for the conductive elements.

4. The package of claim 3, wherein the insulative layer comprises a solder mask.

5. The package of claim 1, further including an insulative layer over the upper surface of the base laminate between the conductive traces and the layer of dielectric material with an exception of at least one aperture permitting electrical contact between the at least one conductive path and a via.

6. The package of claim 5, wherein the at least one conductive path directly contacts the via.

7. The package of claim 1, further including a semiconductor die secured to the base laminate within the cavity and electrically connected to at least some of the conductive traces.

8. The package of claim 7, wherein the semiconductor die is back-bonded to the base laminate and electrically connected to the at least some of the conductive traces by intermediate conductive elements.

9. The package of claim 8, wherein the semiconductor die is back-bonded to a conductive die-attach pad on the base laminate disposed in the interior location and electrically connected by a via through the layer of dielectric material to an associated conductive element on the lower surface of the base laminate.

10. The package of claim 9, wherein the semiconductor die is back-bonded by a conductive bonding material for connection to a reference potential.

11. The package of claim 9, wherein the semiconductor die is back-bonded by a non-conductive material.

12. The package of claim 11, wherein the conductive die-attach pad is adapted to provide power to the die, and at least one bond pad on an active surface of the die is connected to the die-attach pad by an intermediate conductive element.

13. The package of claim 7, wherein the semiconductor die is inverted within the cavity and electrically connected to at least some of the conductive traces by intermediate conductive elements extending transversely between an active surface of the semiconductor die and the at least some of the conductive traces.

14. The package of claim 13, wherein a back side of the semiconductor die is electrically connected to the ground plane element.

15. The package of claim 14, wherein at least a portion of the ground plane element extends over the back side of the semiconductor die to effect the electrical connection therebetween.

16. The package of claim 14, wherein the electrical connection between the back side of the semiconductor die and the ground plane element is effected through an intermediate conductive element.

17. The package of claim 7, wherein a non-conductive material disposed in the cavity encapsulates the semiconductor die, the intermediate conductive elements and the at least some conductive trace ends.

18. The package of claim 17, wherein the ground plane element includes an aperture therethrough aligned with the cavity.

19. The package of claim 1, wherein the ground plane element includes an aperture therethrough aligned with the cavity.

20. The package of claim 7, wherein the ground plane element extends over the cavity to define a chamber substantially enclosing the die.

21. The package of claim 20, wherein the ground plane element includes a downwardly facing recess portion over the cavity.

22. The package of claim 21, wherein at least a portion of the ground plane element extending over the cavity includes a non-conductive layer on an interior surface thereof.

23. The package of claim 8, wherein at least the intermediate conductive elements are substantially coated with a non-conductive material.

24. The package of claim 1, further including a conductive die-attach pad on the base laminate disposed in the interior location and electrically connected by a via through the layer of dielectric material to an associated conductive element on the lower surface of the base laminate.

25. The package of claim 1, wherein the conductive elements comprise solder elements or conductive adhesive elements.

26. The package of claim 1, wherein the ground plane element comprises a conductive reference plane element.

27. The package of claim 1, wherein the ground plane element is of sufficient thickness to impart substantial rigidity to the package.

28. The package of claim 1, wherein the ground plane element is configured so as to impart substantial rigidity to the package.

29. The package of claim 7, wherein the ground plane element is configured to facilitate heat transfer from the semiconductor die.

30. The package of claim 1, wherein the ground plane element comprises an electrically conductive element.

31. A semiconductor die assembly, comprising:
a substantially planar base laminate comprising a dielectric having a plurality of conductive traces on an upper surface thereof extending from proximately an interior location of the base laminate to other locations coincident with conductive vias extending through the base laminate to associated conductive bonding elements on a lower surface of the base laminate;
a layer of dielectric material extending at least partially over the plurality conductive traces on the upper surface of the base laminate and about the interior location to define a cavity having at least some conductive trace ends exposed therein, the layer of dielectric material having at least one conductive path extending transversely therethrough;
a semiconductor die disposed in the cavity, secured to the base laminate and in electrical contact with at least some of the conductive traces; and
a ground plane element electrically connected to at least one of the conductive traces by the at least one conductive path extending transversely through the layer of dielectric material, the ground plane element extending at least proximate the cavity and at least partially overlying portions of the plurality of conductive traces lying outside of the cavity.

32. The assembly of claim 31, wherein the semiconductor die is back-bonded to the base laminate and electrically connected to the at least some conductive trace ends by wire bonds.

33. The assembly of claim 32, further comprising a non-conductive material disposed in the cavity to encapsulate at least the semiconductor die, the wire bonds and the at least some conductive trace ends.

34. The assembly of claim 33, wherein the ground plane element includes an aperture therethrough aligned with the cavity.

35. The assembly of claim 31, wherein the ground plane element includes an aperture therethrough aligned with the cavity.

36. The assembly of claim 31, wherein the ground plane element extends over the cavity to define a chamber substantially enclosing the semiconductor die.

37. The assembly of claim 36, wherein the ground plane element includes a downwardly facing recess portion over the cavity.

38. The assembly of claim 36, wherein at least a portion of the ground plane element extending over the cavity includes a non-conductive layer on an interior surface thereof.

39. The assembly of claim 36, wherein at least connections between the semiconductor die and the at least some of the conductive traces are covered with non-conductive material.

40. The assembly of claim 31, further including a conductive die-attach pad in the interior location electrically connected with a via through the layer of dielectric material to an associated conductive element on the lower surface of the base laminate.

41. The assembly of claim 40, wherein the semiconductor die is back-bonded to the base laminate and electrically connected to the at least some of the conductive traces by intermediate conductive elements.

42. The assembly of claim 31, wherein the semiconductor die is back-bonded to a conductive die-attach pad on the base laminate disposed in the interior location and electrically connected by a via through the layer of dielectric material to an associated conductive element on the lower surface of the base laminate.

43. The assembly of claim 42, wherein the semiconductor die is back-bonded by a conductive bonding material for connection to a reference potential.

44. The assembly of claim 42, wherein the semiconductor die is back-bonded by a non-conductive material.

45. The assembly of claim 40, wherein the conductive die-attach pad is adapted to provide power to the semiconductor die, and at least one bond pad on an active surface of the semiconductor die is connected to the semiconductor die-attach pad by an intermediate conductive element.

46. The assembly of claim 31, wherein the semiconductor die is inverted within the cavity and electrically connected to at least some of the conductive traces by intermediate conductive elements extending transversely between an active surface of the semiconductor die and the at least some of the conductive traces.

47. The assembly of claim 46, wherein a back side of the semiconductor die is electrically connected to the ground plane element.

48. The assembly of claim 47, wherein at least a portion of the ground plane element extends over the back side of the semiconductor die to effect the electrical connection therebetween.

49. The assembly of claim 47, wherein the electrical connection between the back side of the semiconductor die and the ground plane element is effected through an intermediate conductive element.

50. The assembly of claim 46, further comprising a non-conductive material disposed in the cavity to encapsulate at least the semiconductor die, the intermediate conductive elements and the at least some conductive trace ends.

51. The assembly of claim 31, wherein the conductive bonding elements comprise solder elements or conductive adhesive elements.

52. The assembly of claim 31, wherein the ground plane element is of sufficient thickness to impart substantial rigidity to the assembly.

53. The assembly of claim 31, wherein the ground plane element is configured so as to impart substantial rigidity to the assembly.

54. The assembly of claim 31, wherein the ground plane element is configured to facilitate heat transfer from the semiconductor die.

55. The assembly of claim 31, wherein the ground plane element comprises an electrically conductive element.

* * * * *

UNITED STATES PATENT AND TRADEMARK OFFICE
CERTIFICATE OF CORRECTION

PATENT NO. : 6,740,971 B2
APPLICATION NO. : 10/011525
DATED : May 25, 2004
INVENTOR(S) : Jerry M. Brooks and Steven G. Thummel It is certified that error appears in the above-identified patent and that said Letters Patent is hereby corrected as shown below:

On the title page:
In Item (57), ABSTRACT,
                LINE 5,      change "anisotropically-conductive" to --anisotropically conductive--
                LINES 15-16,  change "anisotropically-conductive" to --anisotropically conductive--

In the specification:
    COLUMN 1,    LINE 7,     change "continuation application" to --continuation of application--
    COLUMN 8,    LINE 57,    change "closely adjacent," to --closely adjacent--

In the claims:
CLAIM 1,  COLUMN 10,  LINE 11,    delete "extending at least proximate the cavity and"
CLAIM 5,  COLUMN 10,  LINES 25-26,  change "between the conductive traces" to --between the plurality of conductive traces--
CLAIM 12, COLUMN 10,  LINE 51,    change "to the die," to --to the semiconductor die,--
CLAIM 12, COLUMN 10,  LINE 52,    change "of the die" to --of the semiconductor die--
CLAIM 12, COLUMN 10,  LINE 53,    change "the die-attach" to --the conductive die-attach--
CLAIM 20, COLUMN 11,  LINE 16,    change "the die." to --the semiconductor die.--

UNITED STATES PATENT AND TRADEMARK OFFICE
CERTIFICATE OF CORRECTION

PATENT NO. : 6,740,971 B2
APPLICATION NO. : 10/011525
DATED : May 25, 2004
INVENTOR(S) : Jerry M. Brooks and Steven G. Thummel It is certified that error appears in the above-identified patent and that said Letters Patent is hereby corrected as shown below:

In the claims (continued):

| | | |
|---|---|---|
| CLAIM 31, COLUMN 11, | LINE 57, | change "the plurality conductive" to --the plurality of conductive-- |
| CLAIM 31, COLUMN 11, | LINE 66, | change "a ground plane element electrically" to --a ground plane element secured to an upper surface of the layer of dielectric material and electrically-- |
| CLAIM 31, COLUMN 12, | LINE 2-3, | after "ground plane element" delete "extending at least proximate the cavity and" |
| CLAIM 45, COLUMN 12, | LINE 57, | change "connected to the semiconductor" to --connected to the conductive-- |

Signed and Sealed this

Twenty-ninth Day of January, 2008

JON W. DUDAS
*Director of the United States Patent and Trademark Office*